(12) United States Patent
Yi et al.

(10) Patent No.: US 11,862,682 B2
(45) Date of Patent: Jan. 2, 2024

(54) SEMICONDUCTOR DEVICE

(71) Applicant: Samsung Electronics Co., Ltd., Suwon-si (KR)

(72) Inventors: Jihye Yi, Suwon-si (KR); Moonseung Yang, Suwon-si (KR); Jungtaek Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 38 days.

(21) Appl. No.: 17/511,778

(22) Filed: Oct. 27, 2021

(65) Prior Publication Data

US 2022/0052161 A1     Feb. 17, 2022

Related U.S. Application Data

(62) Division of application No. 16/750,273, filed on Jan. 23, 2020, now Pat. No. 11,183,562.

(30) Foreign Application Priority Data

Jun. 11, 2019   (KR) .................. 10-2019-0068892

(51) Int. Cl.
*H01L 29/10*     (2006.01)
*H01L 29/417*    (2006.01)
(Continued)

(52) U.S. Cl.
CPC ...... *H01L 29/1037* (2013.01); *H01L 29/0673* (2013.01); *H01L 29/165* (2013.01);
(Continued)

(58) Field of Classification Search
CPC .......... H01L 29/1037; H01L 29/41775; H01L 29/42392; H01L 29/165; H01L 29/66795; H01L 29/785; H01L 29/0673; H01L 29/6656; H01L 29/66553; H01L 21/02532; H01L 21/30604; H01L 21/308; H01L 29/66545; H01L 29/6653; H01L 21/31116; H01L 21/02636; H01L 21/26513; H01L 29/7848; H01L 29/66439; H01L 29/0847; H01L 29/78696; H01L 29/161;
(Continued)

(56) References Cited

U.S. PATENT DOCUMENTS 9,502,518 B2   11/2016  Liu et al.
9,831,323 B2   11/2017  Kittl et al.
(Continued)

*Primary Examiner* — Cuong B Nguyen
(74) *Attorney, Agent, or Firm* — Harness, Dickey & Pierce, P.L.C.

(57) ABSTRACT

A semiconductor device includes a substrate including an active region in a first direction, a plurality of channel layers on the active region and disposed in a direction perpendicular to an upper surface of the substrate, a gate electrode respectively surrounding the plurality of channel layers, and a source/drain structure respectively disposed on both sides of the gate electrode in the first direction and connected to each of the plurality of channel layers. The gate electrode extends in a second direction crossing the first direction. The gate electrode includes an overlapped portion in a region of the gate electrode on an uppermost channel layer of the plurality of channel layers. The overlapped portion of the gate electrode overlaps the source/drain structure in the first direction and has a side surface inclined toward the upper surface of the substrate.

20 Claims, 16 Drawing Sheets

(51) Int. Cl.
    *H01L 29/423*     (2006.01)
    *H01L 29/165*     (2006.01)
    *H01L 29/66*     (2006.01)
    *H01L 29/78*     (2006.01)
    *H01L 29/06*     (2006.01)
    *H01L 21/02*     (2006.01)
    *H01L 21/306*     (2006.01)
    *H01L 21/308*     (2006.01)
    *H01L 21/311*     (2006.01)
    *H01L 21/265*     (2006.01)

(52) U.S. Cl.
    CPC .. H01L 29/41775 (2013.01); H01L 29/42392 (2013.01); H01L 29/66795 (2013.01); H01L 29/785 (2013.01); *H01L 21/02532* (2013.01); *H01L 21/02636* (2013.01); *H01L 21/26513* (2013.01); *H01L 21/308* (2013.01); *H01L 21/30604* (2013.01); *H01L 21/31116* (2013.01); *H01L 29/6653* (2013.01); *H01L 29/6656* (2013.01); *H01L 29/66545* (2013.01); *H01L 29/66553* (2013.01); *H01L 29/7848* (2013.01)

(58) Field of Classification Search
    CPC ........... H01L 29/775; H01L 21/823412; H01L 21/823431; H01L 21/823437; H01L 21/823462; H01L 29/7849; B82Y 10/00
    See application file for complete search history.

(56) References Cited

U.S. PATENT DOCUMENTS

| | | |
|---|---|---|
| 9,941,405 B2 | 4/2018 | Kittl et al. |
| 2005/0285098 A1 | 12/2005 | Fathimulla et al. |
| 2018/0083113 A1 | 3/2018 | Balakrishnan et al. |
| 2018/0108787 A1 | 4/2018 | Cheng et al. |
| 2018/0175035 A1 | 6/2018 | Yang et al. |
| 2018/0301531 A1 | 10/2018 | Xie |
| 2018/0374926 A1 | 12/2018 | Lee et al. |

II-II'

SEMICONDUCTOR DEVICE

CROSS-REFERENCE TO RELATED APPLICATION(S)

This application is a divisional of U.S. application Ser. No. 16/750,273, filed Jan. 23, 2020, which claims benefit of priority to Korean Patent Application No. 10-2019-0068892, filed on Jun. 11, 2019 in the Korean Intellectual Property Office, the disclosure of each which is incorporated herein by reference in its entirety.

BACKGROUND

The present disclosure relates to a semiconductor device.

Recently, a semiconductor device has been designed to be downscaled. In addition, as a semiconductor device may have a high operational speed with accuracy in operations, a large volume of studies into optimization of a structure of a transistor included in a semiconductor device have been conducted. As one scaling technique to improve density of an integrated circuit device, a semiconductor device, including a FinFET having a channel with a three-dimensional structure in which an active fin is formed on a substrate and a gate is formed using the active fin, has been developed.

SUMMARY

Example embodiments provide a semiconductor device having a three-dimensional structure with improved electrical characteristics.

According to an example embodiment, a semiconductor device includes a substrate including an active region extending in a first direction, a plurality of channel layers on the active region and disposed in a direction perpendicular to an upper surface of the substrate, a gate electrode respectively surrounding the plurality of channel layers, and a source/drain structure respectively disposed on both sides of the gate electrode in the first direction. The gate electrode extends in a second direction crossing the first direction. The source/drain structure is connected to each of the plurality of channel layers. The gate electrode includes an overlapped portion in a region of the gate electrode located on an uppermost channel layer of the plurality of channel layers. The overlapped portion of the gate electrode overlaps the source/drain structure in the first direction, and the overlapped portion of the gate electrode has a side surface inclined toward the upper surface of the substrate.

According to an example embodiment, a semiconductor device including an active region extending in a first direction, a plurality of channel layers on the active region and disposed in a direction perpendicular to an upper surface of the substrate, a gate electrode respectively surrounding the plurality of channel layers, and a source/drain structure disposed on at least one side of the gate electrode. The gate electrode extends in a second direction crossing the first direction. The source/drain structure is connected to the plurality of channel layers. A portion of the gate electrode contacts an upper surface of an uppermost channel layer of the plurality of channel layers. The portion of the gate electrode has a width smaller than a width of the gate electrode at a same level as an upper surface of the source/drain structure in a cross-section in the first direction.

According to an example embodiment, a semiconductor device includes a substrate including an active region extending in a first direction, a plurality of channel layers on the active region and disposed in a direction perpendicular to an upper surface of the substrate, a gate electrode respectively surrounding the plurality of channel layers, and a source/drain structure disposed on both sides of the gate electrode. The gate electrode extends in a second direction crossing the first direction. The gate electrode includes a first portion and a second portion on an uppermost channel layer of the plurality of channel layers. The first portion is on the second portion. The gate electrode further includes a silicon cap layer between the first portion and the second portion. The second portion of the gate electrode overlap the source/drain structure in the first direction.

BRIEF DESCRIPTION OF DRAWINGS

The above and other aspects, features, and advantages of inventive concepts will be more clearly understood from the following detailed description, taken in conjunction with the accompanying drawings, in which.

DETAILED DESCRIPTION

Hereinafter, example embodiments of inventive concepts will be described as follows with reference to the accompanying drawings.

Figure 1:
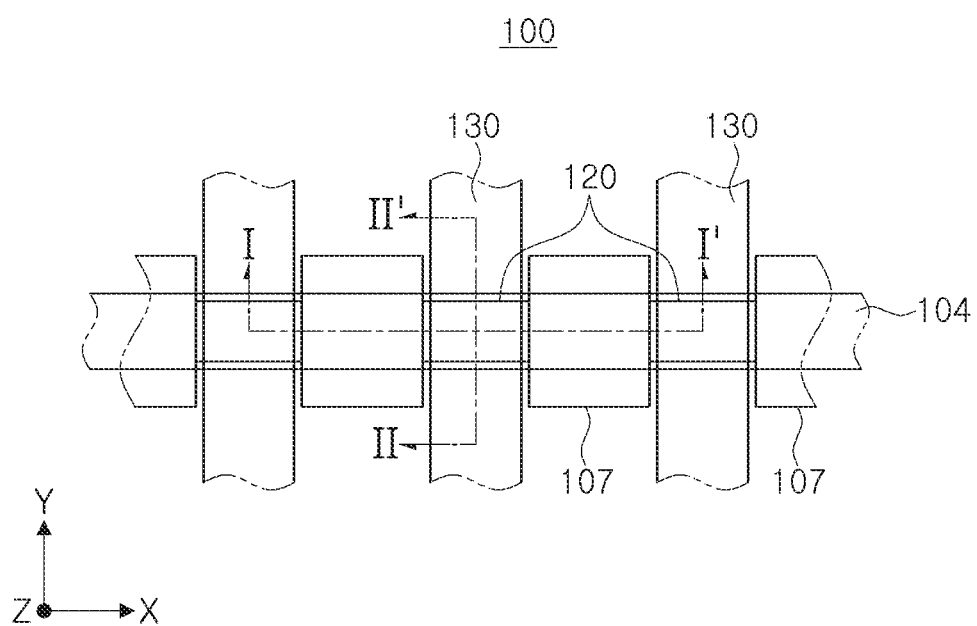
FIG. 1 is a plan view illustrating a semiconductor device according to an example embodiment.
Figure 2:
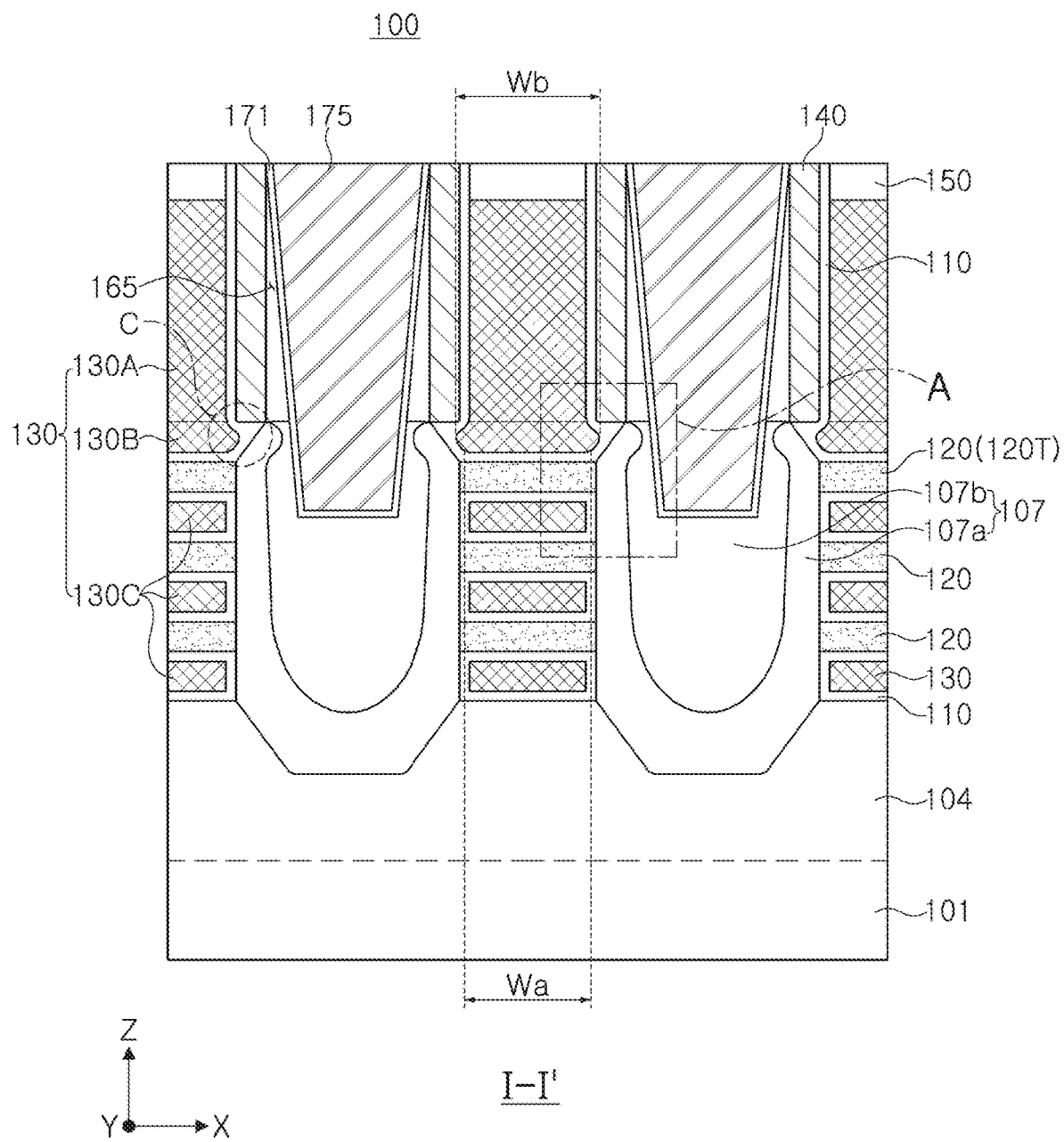
FIG. 2 is a cross-sectional view taken along line I-I' of the semiconductor device of FIG. 1.
Figure 3:
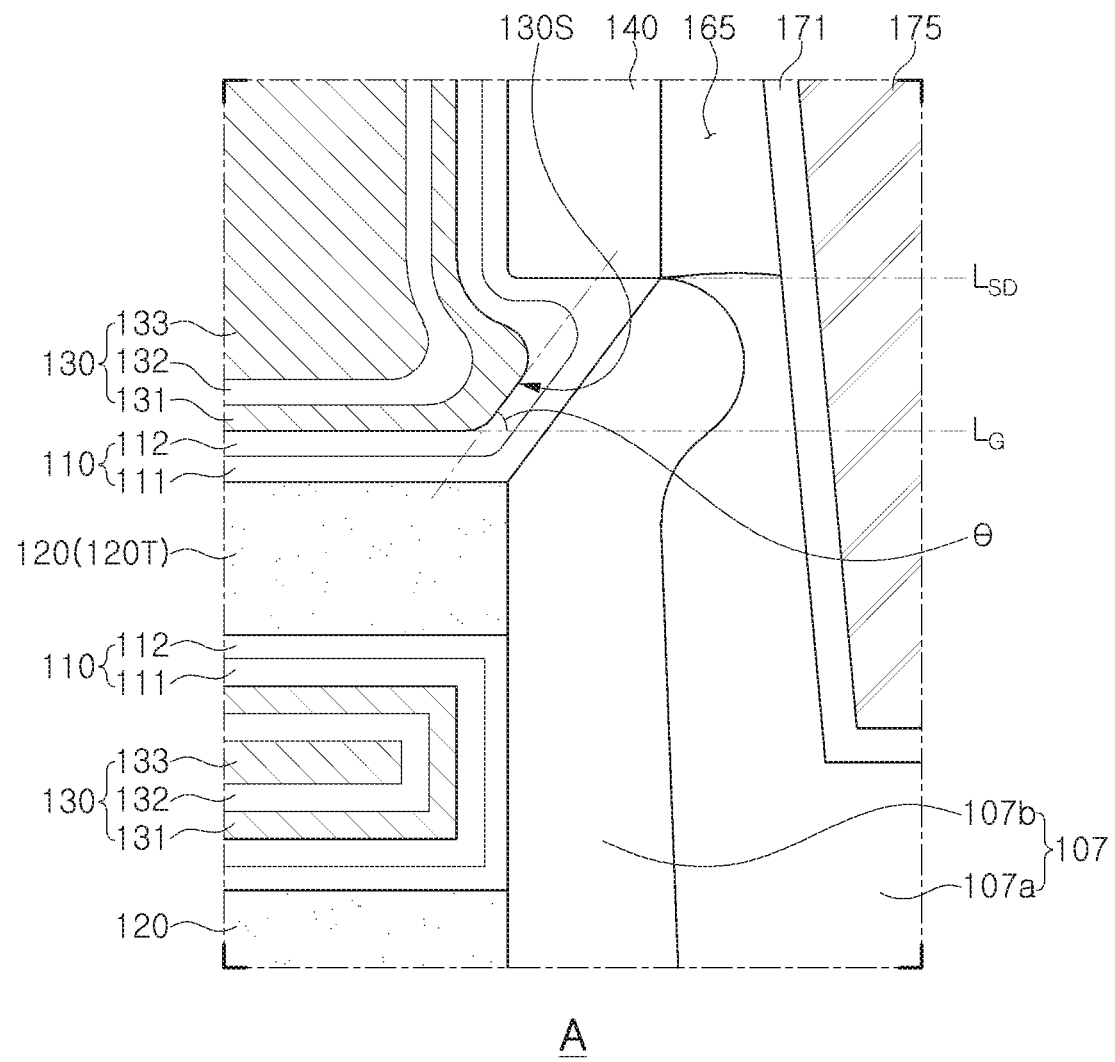
FIG. 3 is an enlarged view illustrating region A of the semiconductor device illustrated in FIG. 2.

FIG. 1 is a plan view illustrating a semiconductor device according to an example embodiment of inventive concepts, FIG. 2 is a cross-sectional view taken along line I-I' of the semiconductor device of FIG. 1, and FIG. 3 is an enlarged view illustrating region A of the semiconductor device illustrated in FIG. 2.

Referring to FIGS. 1 and 2, a semiconductor device 100 according to an example embodiment of inventive concepts may include a protruding portion 104 defining an active region on the substrate 101, and a plurality of gate electrodes 130 disposed to cross the protruding portion 104.

The protruding portion 104 may extend in a first direction (e.g., X direction). The plurality of gate electrodes 130 may extend in a second direction (e.g., Y direction) crossing the first direction. Embedded source/drain regions 107 may be disposed on both sides of the plurality of gate electrodes 130. The source/drain regions 107 may be referred to as source/drain structures 107. A plurality of channel layers 120 penetrating through the plurality of gate electrodes 130 in the first direction may be disposed between the source/drain regions 107. The plurality of gate electrodes 130 may be formed to respectively surround the plurality of channel layers 120.

Figure 4:
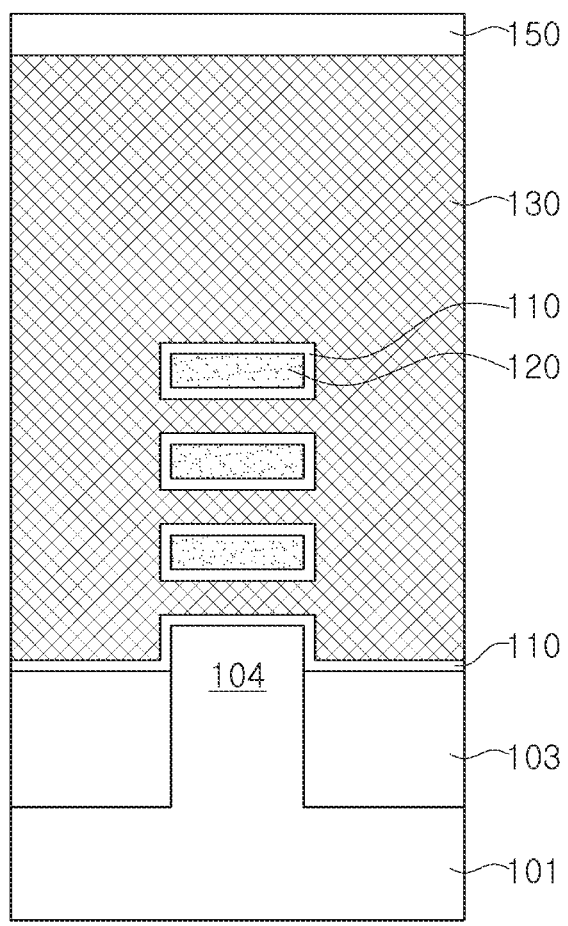
FIG. 4 is a cross-sectional view taken along line II-II' of the semiconductor device illustrated in FIG. 1.

Referring to FIGS. 2 and 4, the semiconductor device 100 according to an example embodiment of inventive concepts may include a substrate 101, an isolation insulating layer 103, a source/drain region 107, a gate insulating film 110, a gate electrode 130, a gate spacer 140, a gate cap layer 150, and an interlayer insulating layer 165.

The substrate 101 may be a semiconductor substrate. The semiconductor substrate may include a group IV semiconductor, a group III-V compound semiconductor, and a group II-VI compound semiconductor. The substrate 101 may be a semiconductor on insulator (SOI) substrate (e.g., silicon on insulator).

The substrate 101 may include a protruding portion 104 having a fin shape extending in the first direction. The isolation insulating layer 103 may be disposed on the substrate 101 to cover a side surface of the protruding portion 104 of the substrate 101. An upper surface of the isolation insulating layer 103 may be lower than the upper surface of the protruding portion 104. An upper portion of the protruding portion 104 may protrude further than the upper surface of the isolation insulating layer 103. The protruding portion 104 may also be referred to as an "active region."

The plurality of channel layers 120 extending in the first direction on the protruding portion 104 may be disposed to be spaced apart in a third direction (e.g., Z direction) perpendicular to the upper surface of the substrate 101. In the example embodiment, the channel layers 120 are illustrated as three, but the number thereof is not particularly limited. The channel layers 120 may be formed of semiconductor patterns. For example, the semiconductor patterns may include at least one of silicon (Si), silicon germanium (SiGe), and germanium (Ge).

The source/drain region 107 may be disposed in regions of protruding portion 104 located on both sides of the gate electrodes 130. The source/drain regions 107 may be respectively connected to the channel layers 120. The gate electrode 130 may surround the plurality of channel layers 120, and may extend in a second direction (e.g., Y direction) crossing the first direction (e.g., X direction). A gate insulating film 110 is disposed between the gate electrode 130 and the plurality of channel layers 120.

Specifically, as illustrated in FIG. 4, the gate electrode 130 may be formed to surround the channel layers 120, and may also be disposed on the upper surface of the protruding portion 104 and on the upper surface of the isolation insulating layer 103 in the second direction. In addition, a gate cap layer 150 may be disposed on the upper surface of the gate electrode 130, and gate spacers 140 may be disposed on side surfaces of the gate electrode 130. The gate insulating film 110 may be interposed between each of the channel layers 120 and the gate electrode 130, and may surround outer surfaces of each of the channel layers 120.

The gate insulating film 110 and the gate electrode 130 may be disposed between the channel layers 120 to isolate the channel layers 120 from each other, and the channel layers 120 may be surrounded by the gate insulating film 110 and the gate electrode 130. The channel layers 120 may have a sheet shape that is wider than the thickness thereof. In the example embodiment, edges of the plurality of channel layers 120 are illustrated as having an angular shape, but are not limited thereto. The edges of the plurality of channel layers 120 may have a curvature. In some other example embodiments, the plurality of channel layers 120 may have a wire structure having a circular cross-section or an elliptical cross-section.

The gate insulating film 110 may extend along a bottom surface of the gate electrode 130, and may be interposed between the gate electrode 130 and the protruding portion 104 (the active region) and between the gate electrode 130 and the isolation insulating layer 103, respectively.

As described above, the gate electrode 130, the channel layers 120, and the source/drain region 107 may constitute a gate-all-around type electric field transistor.

The gate electrode 130 may include a doped semiconductor, a conductive metal nitride, and/or a metal. For example, the gate electrode 130 may include metal nitrides such as TiN, WN, and TaN and/or metals such as Ti, W, and Ta. The high dielectric film may include a material having a higher dielectric constant than the silicon oxide film, such as a hafnium oxide (HfO) film, an aluminum oxide (AlO) film, or a tantalum oxide (TaO) film. Each of the gate spacer 140 and the gate cap layer 150 may include at least one of a silicon oxide film, a silicon nitride film, and a silicon oxynitride film.

In a cross-section illustrated in FIG. 2, the gate electrode 130 has portions 130A and 130B located on an uppermost channel layer 120T of the plurality of channel layers 120 and a portion 130C disposed between the plurality of channel layers 120. The portions 130A and 130B located on the uppermost channel layer 120T have the portion 130B overlapping the source/drain region 107 in the first direction.

FIG. 3 is an enlarged view illustrating portion A of FIG. 2. Referring to FIG. 3, an upper surface of the source/drain region 107 may be located at a level $L_{SD}$, higher than a level $L_G$ of a surface in which the gate electrode 130 contacts an upper surface of an uppermost channel layer 120T.

The overlapped portion 130B of the gate electrode 130 has a side surface 130S inclined toward the upper surface of the substrate 101. In some embodiments, an inclined angle θ of the inclined side surface 130S may be in a range of 50° to 80° based on the upper surface of the substrate 101. For example, the gate electrode 130 has a cross-section shape in which a width (Wa) of a surface, in contact with the upper surface of the uppermost channel layer 120T is smaller than a width (Wb) at the same level as the upper surface of the source/drain region 107.

Meanwhile, a side surface of the second portion 130B of the gate electrode 130 may have an inclined plane or a curved surface. In addition, as illustrated in FIG. 3, the gate insulating film 110 may extend to a point between the second portion 130B located on the uppermost channel layer 120T of the gate electrode 130 and the source/drain region 107.

As described above, the gate electrode 130 according to the present embodiment has an innate cross-sectional shape (e.g., inclined plane or curved surface at the second portion 130B) when viewed in the cross-section in the first direction. As a result, deviations between the channel length (or a width) of the uppermost channel layer 120T and the channel length (or a width) of another adjacent channel layer 120 may be greatly reduced. Referring to FIG. 2, although the plurality of channel layers 120 are shown to have substantially similar lengths, some channel layers 120 may actually have different lengths according to their positions.

Figure 11:
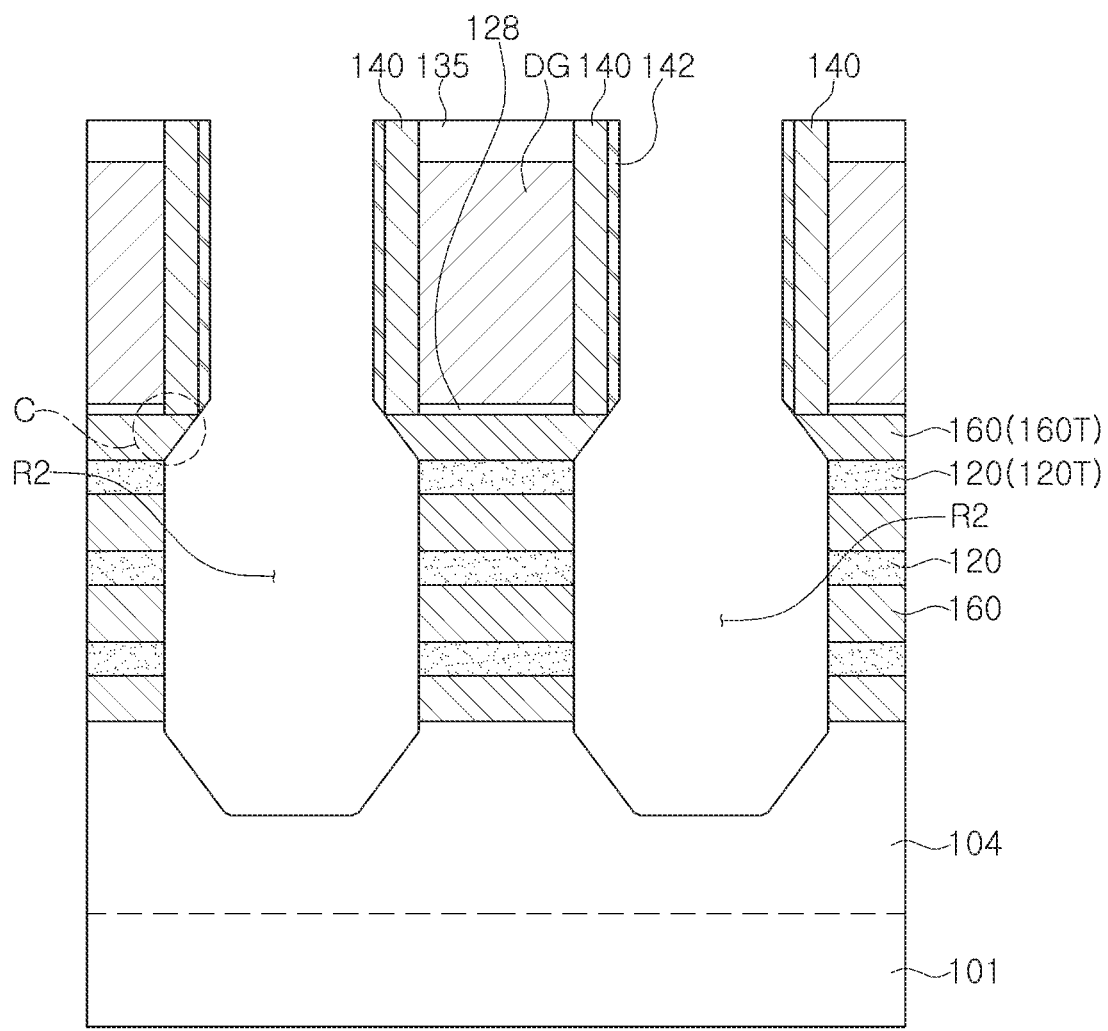

For example, in the recess formation (or expansion) process for the source/drain region 107 (see. FIG. 11), since an undercut C is formed in an upper region of the nanosheet structure, the uppermost channel layer thereof may have a relatively large width with an adjacent channel layer when the channel layer is disposed as an uppermost layer. As described above, when the deviation in the channel length is large, the deviation in strain due to the source/drain region 107 and deviation in the degree of dopant diffusion in the source/drain region 107 occur more, which may cause deterioration of the device performance.

However, according to the example embodiment, since the uppermost channel layer 120T is not located on an uppermost portion of the nanosheet structure, and the second portion 130B of the gate electrode 130 is formed at the position thereof, deviation in the channel length may be reduced, and uniform performance of the channel layers 120 may be guaranteed. For example, in the cross-section in the first direction, the width of the uppermost channel layer 120T according to the present embodiment may have deviation of 20% or less from the width of another adjacent channel layer 120, and the performance deviation according to the channel length may be greatly reduced.

In another aspect, the source/drain region 107 may have a side surface that is inclined to be in contact with the second portion 130B of the gate electrode. In some example embodiments, side surfaces of the source/drain regions 107 may also have inclined planes or curved surfaces similar to the side surfaces of the second portion 130B of the gate electrode 130.

The source/drain region 107 may include first and second epitaxial regions 107a and 107b having different compositions from each other. For example, the first and second epitaxial regions 107a and 107b include SiGe having different germanium (Ge) contents, and the Ge content of the second epitaxial region 107b may be higher than the Ge content of the first epitaxial region 107a. In another example embodiment, it may be divided into three or more epitaxial regions, and may be deposited to gradually increase the germanium content.

Although the upper surfaces of the source/drain regions 107 are illustrated as being formed at a higher level than the second portion of the gate electrode, inventive concepts is not limited thereto. The upper surfaces of the source/drain regions 107 may be formed to be higher than the upper surface of the uppermost channel layer 120T such that the source/drain regions 107 are respectively connected to all the channel layers 120. The upper surface of the source/drain region 107 may be formed to have a convex curved surface, but is not limited thereto.

The gate electrode 130 may be disposed between the source/drain regions 107, and may extend in a second direction (e.g., Y axis direction) crossing the first direction on the substrate 101. The gate electrode 130 and the source/drain regions 107 may be insulated by the gate insulating film 110. The gate electrode 130 may be formed to surround the channel layers 120. The gate insulating film 110 may be disposed between the gate electrode 130 and the channel layers 120 and between the gate electrodes 130 and the gate spacers 140. The gate electrode 130 may also be formed on the isolation insulating film 103. The gate insulating film 110 may also be disposed between the gate electrode 130 and the isolation insulating layer 103.

Gate spacers 140 extending in the same direction as the gate electrode 130 may be disposed on both sidewalls of the gate electrode 130. The gate spacers 140 may be formed of silicon oxynitride (SiON), silicon nitride (SiN), SiOC, SiOCN, SiBCN, or a combination thereof. A gate cap layer 150 for protecting the gate electrode may be disposed on the gate electrode 130. The gate cap layer 150 may include silicon nitride.

Referring to FIG. 3, the gate insulating film 110 may include a plurality of layers. In an example embodiment, the gate insulating film 110 may include a first insulating layer 111 and a second insulating layer 112. The first insulating layer 111 and the second insulating layer 112 may have different dielectric constants, and the dielectric constant of the second insulating layer 112 may be greater than the dielectric constant of the first insulating layer 111. In this case, the second insulating layer 112 may be disposed closer to the channel layer 120 than the first insulating layer 111.

That is, the first insulating layer 111 may be disposed closer to the gate electrode 130 than the second insulating layer 112. Meanwhile, the second insulating layer 112 having a relatively higher dielectric constant may have a larger thickness than the first insulating layer 111.

The second insulating layer 112 having a relatively high dielectric constant may include a high dielectric constant dielectric material. The high dielectric constant dielectric material may be aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide (ZrSixOy), hafnium oxide ($HfO_2$), It may be any one of hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), praseodymium oxide ($Pr_2O_3$), or a combination thereof.

All of the plurality of metal layers included in the gate electrode 130 may be disposed between the channel layers 120. A barrier metal layer 131 may be disposed adjacent to the gate insulating film 110, a work function metal layer 132 may be disposed on the barrier metal layer 131, and a gate metal layer 133 may be disposed on the work function metal layer 132. In some example embodiments, some layers may be omitted or added. For example, a space between the channel layers 120 may only be filled with the barrier metal layer 131 and the work function metal layer 132 together with the gate insulating film 110.

The barrier metal layer 131 may include metal nitrides such as TiN, TaN, TaSiN, TiSiN, and the like. The work function metal layer 132 may determine a threshold voltage of the semiconductor device 100. In some embodiments, the work function metal layer 132 may include a plurality of metal layers stacked to each other. For example, the work function metal layer 132 may include ruthenium (Ru), palladium (Pd), platinum (Pt), cobalt (Co), nickel (Ni), or a combination thereof. The gate metal layer 133 may be formed of a metal material such as tungsten.

An interlayer insulating layer 165 may cover embedded source/drain regions 107. An upper surface of the interlayer insulating layer 165 may form a coplanar surface with an upper surface of the gate cap layer 150. The interlayer insulating layer 165 may include at least one of a silicon oxide film, a silicon nitride film, a silicon oxynitride film, or a low dielectric film. The upper surface of the gate cap layer 150 may be substantially coplanar with an upper surface of the interlayer insulating layer 165. The gate spacers 140 may be interposed between the gate cap layer 150 and the interlayer insulating layer 165.

Contact plugs 175 respectively connected to the source/drain regions 107 may be provided through the interlayer insulating layer 165. The contact plugs 175 may be in contact with the source/drain regions 107. A conductive barrier 171 may be formed on surfaces of the contact plugs 175. The contact plugs 175 may be recessed in the source/drain region 107 to overlap the uppermost channel layer 120T of the plurality of channel layers 120 in the first direction. For example, the conductive barrier 171 may be formed of a metal nitride such as TiN, TaN, or WN. The contact plug 175 may be formed of tungsten (W), cobalt (Co), titanium (Ti), an alloy thereof, or a combination thereof.

Figure 5:
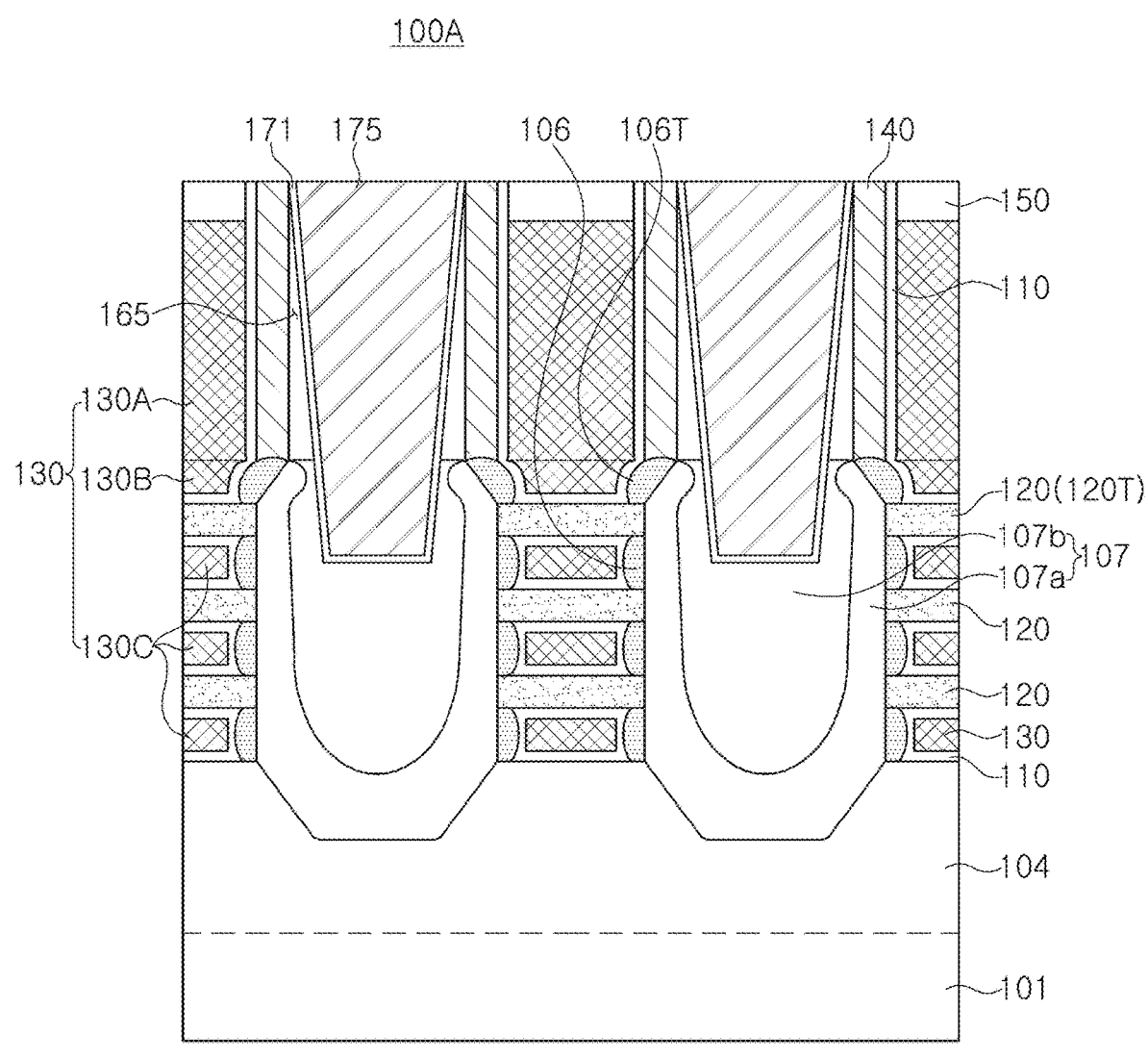
FIG. 5 is a plan view illustrating a semiconductor device according to an example embodiment.

FIG. 5 is a plan view illustrating a semiconductor device according to an example embodiment.

Referring to FIG. 5, it may be understood that a semiconductor device 100A according to an example embodiment is similar to the semiconductor device 100 illustrated in FIGS. 1 to 4, except that internal spacers 106 are formed on both sides of the channel layers CH. In addition, the components of the example embodiment may be understood with reference to the descriptions of the same or similar components of the semiconductor device 100 illustrated in FIGS. 1 and 2 unless specifically described otherwise.

In the semiconductor device 100A according to the example embodiment, internal spacers 106 disposed on both sides of the gate electrode 130 in the first direction (e.g., X direction) between the plurality of channel layers 120 may be further included. The internal spacers 106 may be disposed between the gate electrode 130 and source/drain region 107. For example, the internal spacers 106 may include at least one selected from a group consisting of SiN, SiCN, SiON, SiBN, SiOCN, SiBCN, and SiOC.

The internal spacers 106 may be formed after the recess formation (the process of FIG. 10) and before the epitaxial growth (the process of FIG. 12) in the process of forming the source/drain region 107 among processes to be described later. Specifically, the internal spacers 106 may be formed by partially etching sacrificial patterns 160 after the recess formation and before the epitaxial growth, and depositing an insulator in the etched space. In this process, both sides of the portion of the gate electrode 130 located on the uppermost channel layer 120T may also be exposed by the recess and etched to form internal spacers 106T, as illustrated in FIG. 5. Since the internal spacers 106T are formed along the inclined surface, the internal spacers 106T may have a shape different from that of the internal spacers 106 of the other channel layers 120.

Figure 6:
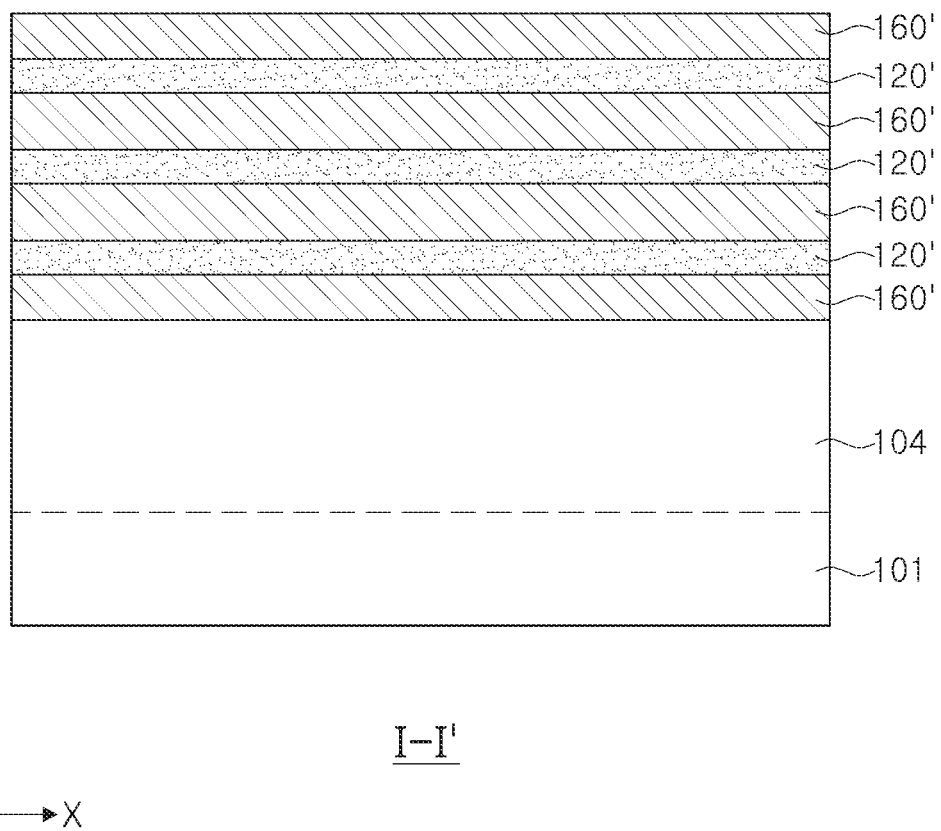
FIGS. 6 to 15 are cross-sectional views illustrating processes for manufacturing the semiconductor device of FIG. 1.
Figure 7:
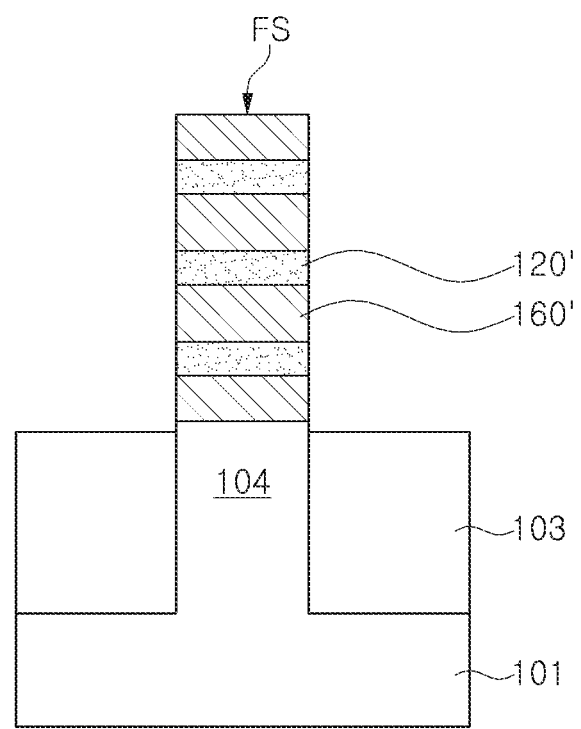
Figure 8:
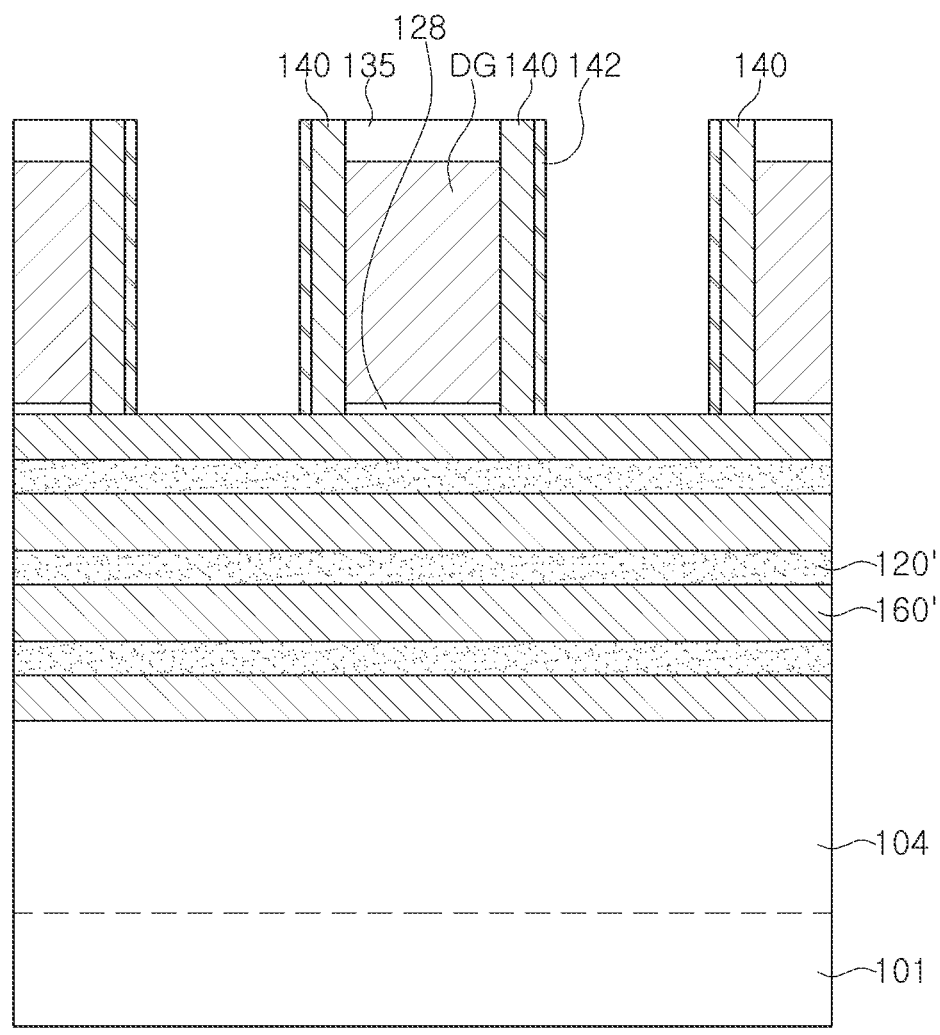
Figure 9:
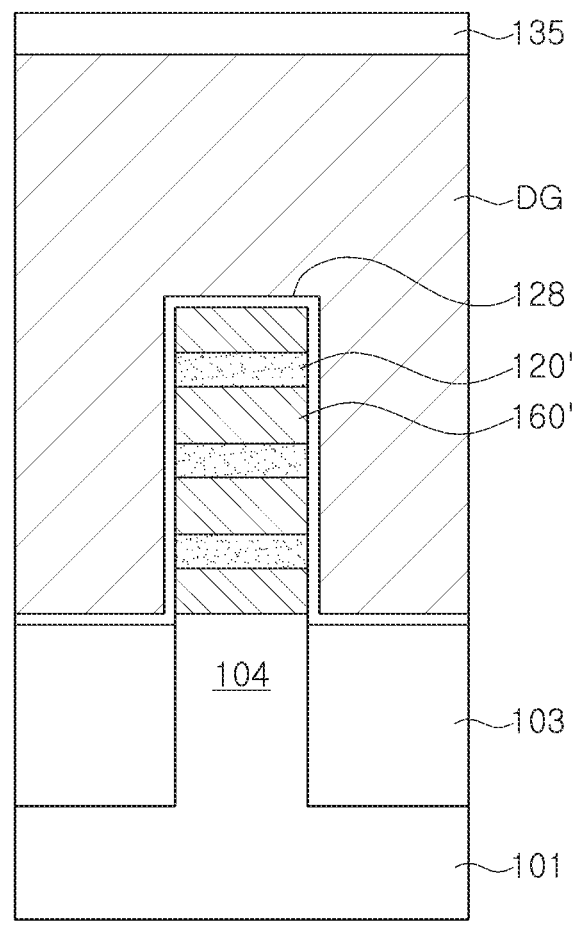

FIGS. 6 to 15 are cross-sectional views illustrating processes for manufacturing the semiconductor device of FIG. 1. Specifically, FIGS. 6, 8, 10 to 15 are cross-sectional views taken along line I-I' of FIG. 1, and FIGS. 7 and 9 are cross-sectional views taken along line II-II' of FIG. 1.

Referring to FIG. 6, a plurality of sacrificial layers 160' and a plurality of semiconductor layers 120' may be alternately stacked on the substrate 101.

A stacked structure in which the plurality of sacrificial layers 160' and the plurality of semiconductor layers 120' are alternately disposed may be formed on the substrate 101 such that the sacrificial layer 160 is located on the uppermost portion thereof. The stacked structure employed in the example embodiment is illustrated as including four sacrificial layers 160' and three semiconductor layers 120', but is not limited thereto. The plurality of semiconductor layers 120' may include a semiconductor material, and the plurality of sacrificial layers 160' may include a semiconductor material having etch selectivity with the plurality of semiconductor layers 120'. For example, the plurality of semiconductor layers 120' may include silicon (Si), and the plurality of sacrificial layers 160' may include silicon-germanium (SiGe). The plurality of sacrificial layers 160' may be silicon-germanium having a germanium content of 30% or more and less than 100%.

Thicknesses of the plurality of semiconductor layers 120' and the plurality of sacrificial layers 160' may be variously changed according to example embodiments. The thicknesses of the plurality of semiconductor layers 120' and the thicknesses of the plurality of sacrificial layers 160' may be several nm to several tens of nm, respectively. For example, the thicknesses of the plurality of sacrificial layers 160' may be greater than the thicknesses of the plurality of semiconductor layers 120'.

Subsequently, referring to FIG. 7, a fin structure FS may be formed by selectively removing portions of the plurality of semiconductor layers 120' and the plurality of sacrificial layers 160' on the substrate 101. The fin structure FS may extend in a first direction (e.g., X direction) on the substrate 101.

The fin structure FS may be formed by applying an anisotropic etching process using a mask pattern to the stacked structures of the plurality of semiconductor layers 120' and the plurality of sacrificial layers 160'. In a process of forming the fin structure FS, a portion of the substrate 101 may be removed to form a protruding portion 104 on the substrate 101. The protruding portion 104 of the substrate 101 may form the fin structure FS together with the plurality of semiconductor layers 120' and the plurality of sacrificial layers 160'. An isolation insulating layer 103 may be formed in a region in which a portion of the substrate 101 is removed. The isolation insulating layer 103 may partially cover a side surface of the protruding portion 104. An upper surface of the isolation insulating layer 103 may be formed to be lower than the upper surface of the protruding portion 104 on the substrate 101. That is, the protruding portion 104 on the substrate 101 may protrude above the isolation insulating layer 103. After the fin structure FS and the isolation insulating layer 103 are formed, the mask pattern may be removed.

Next, referring to FIGS. 8 and 9, a dummy gate pattern DG crossing the fin structure FS may be formed.

A cap layer 135 may be further formed on the dummy gate pattern DG. Gate spacers 140 and sacrificial spacers 142 may be formed on both sidewalls of the dummy gate pattern DG. An etch stop layer 128 may be disposed between the dummy gate pattern DG and the fin structure FS.

The dummy gate pattern DG may extend in a second direction (e.g., Y direction). The etch stop layer 128, the gate spacers 140, and the sacrificial spacers 142 may extend in the same direction as the dummy gate pattern DG. The dummy gate pattern DG and the etch stop layer 128 may cover the fin structure FS protruding onto the isolation insulating layer 103.

The dummy gate pattern DG may be formed of a semiconductor material such as polysilicon. The gate spacers 140 may be formed of silicon oxynitride (SiON), silicon nitride (SiN), SiOC, SiOCN, SiBCN, or a combination thereof. The etch stop layer 128 may be formed of at least one layer selected from silicon oxide, silicon nitride, and silicon oxynitride.

Figure 10:
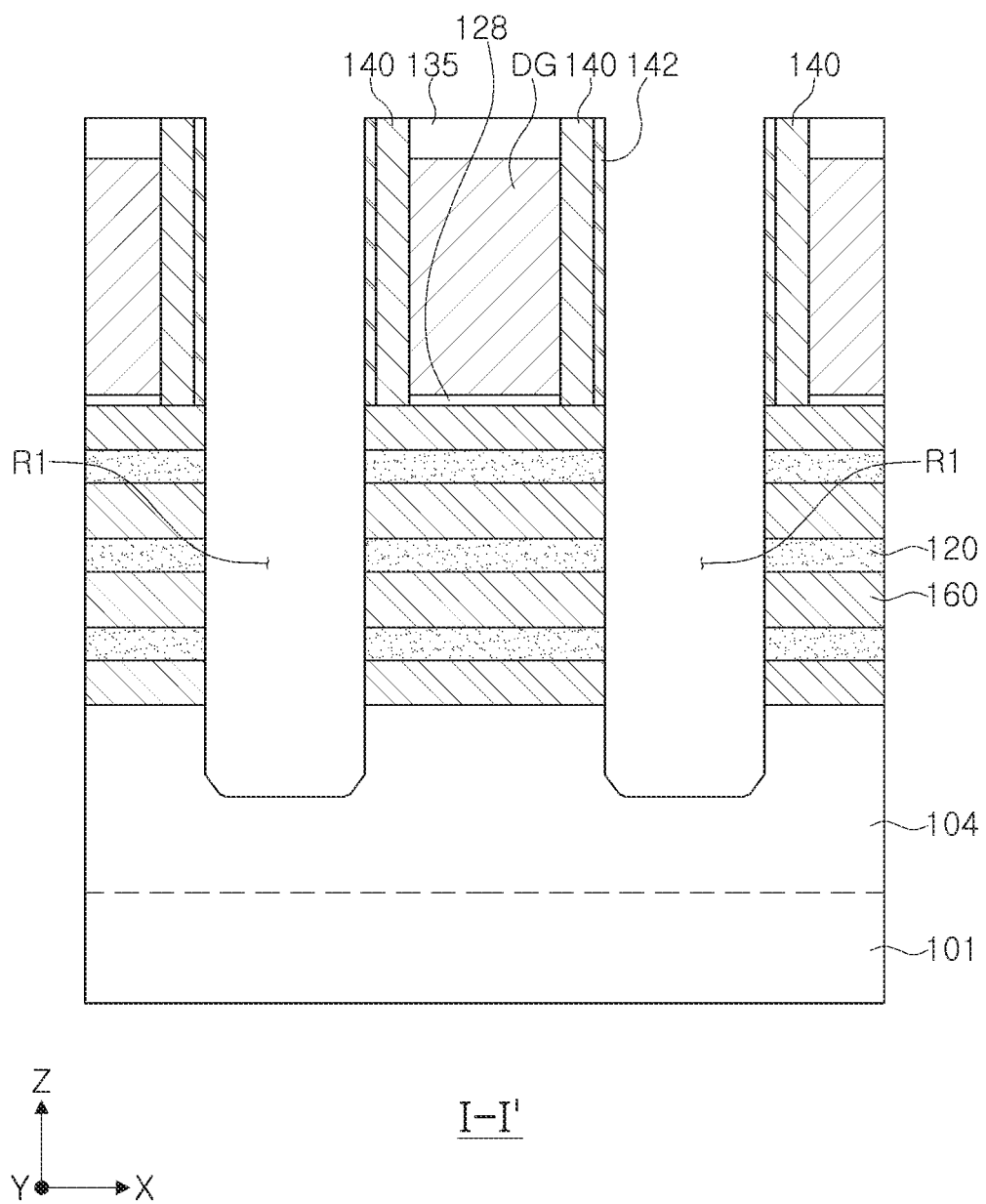

Subsequently, referring to FIG. 10, first recesses R1 may be formed in some regions of the fin structure FS located on both sides of the dummy gates DG.

The present process may be performed by applying an anisotropic dry etching process using the capping layer 135, the dummy gate pattern DG, and the gate spacers 140 as an etching mask. Some exposed regions of the fin structure FS may be selectively removed to form first recesses R1. A plurality of channel layers 120 may be formed below the dummy gate pattern DG by the anisotropic dry etching process. Further, a plurality of sacrificial patterns 160 may be formed between the plurality of channel layers 120. A portion of the upper surface of the substrate 101 may be exposed by the first recesses R1. A portion of the upper surface of the substrate 101 may be etched by the anisotropic dry etching process.

Next, referring to FIG. 11, the first recesses R1 may be expanded using an isotropic dry etching process.

The first recesses R1 located on both sides of the dummy gate pattern DG may be expanded below the gate spacer 140 and the sacrificial spacer 142 by an isotropic etching process to form second recesses R2. In addition, the second recesses R2 may be obtained by additionally etching the upper surface of the exposed substrate 101.

In the present process, an upper region C of the fin structure FS, that is, an uppermost sacrificial pattern 160T may have inclined side surfaces. On the other hand, the uppermost channel layer 120T of the plurality of channel layers 120 is not located in the inclined upper region C, and thus the uppermost channel layer 120T may be formed to have a relatively flat side surface and/or to have a length similar to the length of another adjacent another channel layer 120.

Figure 12:
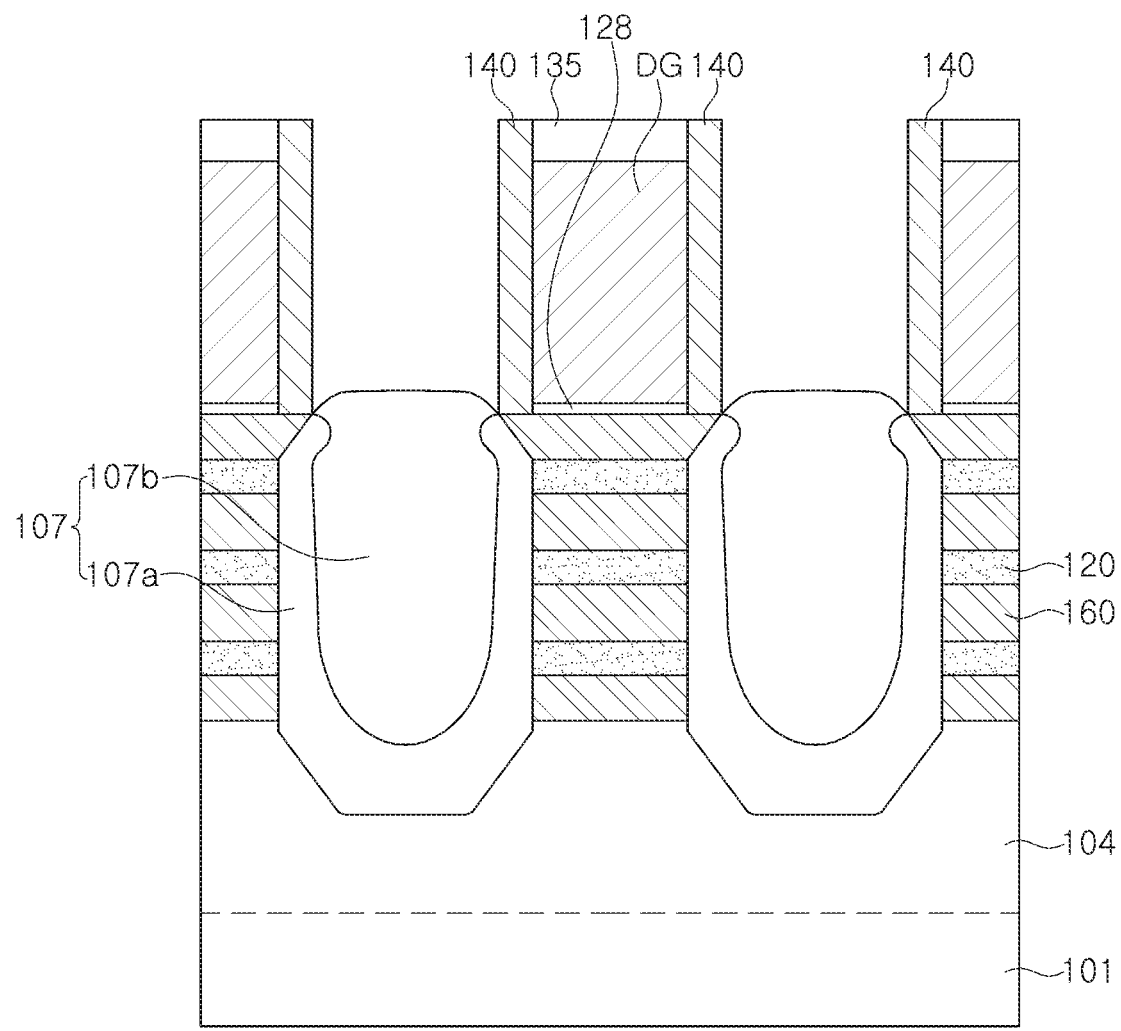

Subsequently, referring to FIG. 12, source/drain regions 107 may be formed from the upper surface of the substrate 101 using a selective epitaxial growth (SEG) process in the expanded second recess R2.

Sacrificial spacers 142 may be removed by a precleaning process. Before forming embedded source/drain regions 107, source/drain regions 107 may be formed through selective epitaxial growth in the second recesses R2. The source drain regions 107 may include a plurality of epitaxial regions having different compositions. For example, in the source/drain regions 107, the first and second epitaxials 107a and 107b may include SiGe having different Ge contents, and the Ge content of the second epitaxial 107b may be higher than the Ge content of the first epitaxial 107a.

In some example embodiments, the source/drain regions 107 may be configured to provide tensile strain in the channel layers CH. For example, when the channel layers CH include silicon Si, the source/drain region SD may include silicon (Si) and/or silicon carbide (SiC). In other example embodiments, the source/drain region SD may be configured to provide compressive strain to the channel layers CH. For example, when the channel layers CH include silicon (Si), the source/drain region SD may include silicon germanium (SiGe). The source/drain region SD may further include a dopant. The dopant may be employed to improve electrical characteristics of the transistor including the source/drain region SD. When the transistor TR is an N-MOSFET, an example of the dopant may be phosphorus (P). When the transistor TR is a P-MOSFET, an example of the dopant may be boron (B). It may be doped with a particular conductive-type dopant. For example, when doped with a p-type dopant, the p-type dopant may be implanted in situ during the selective epitaxial growth process or by a subsequent ion implantation process.

Figure 13:
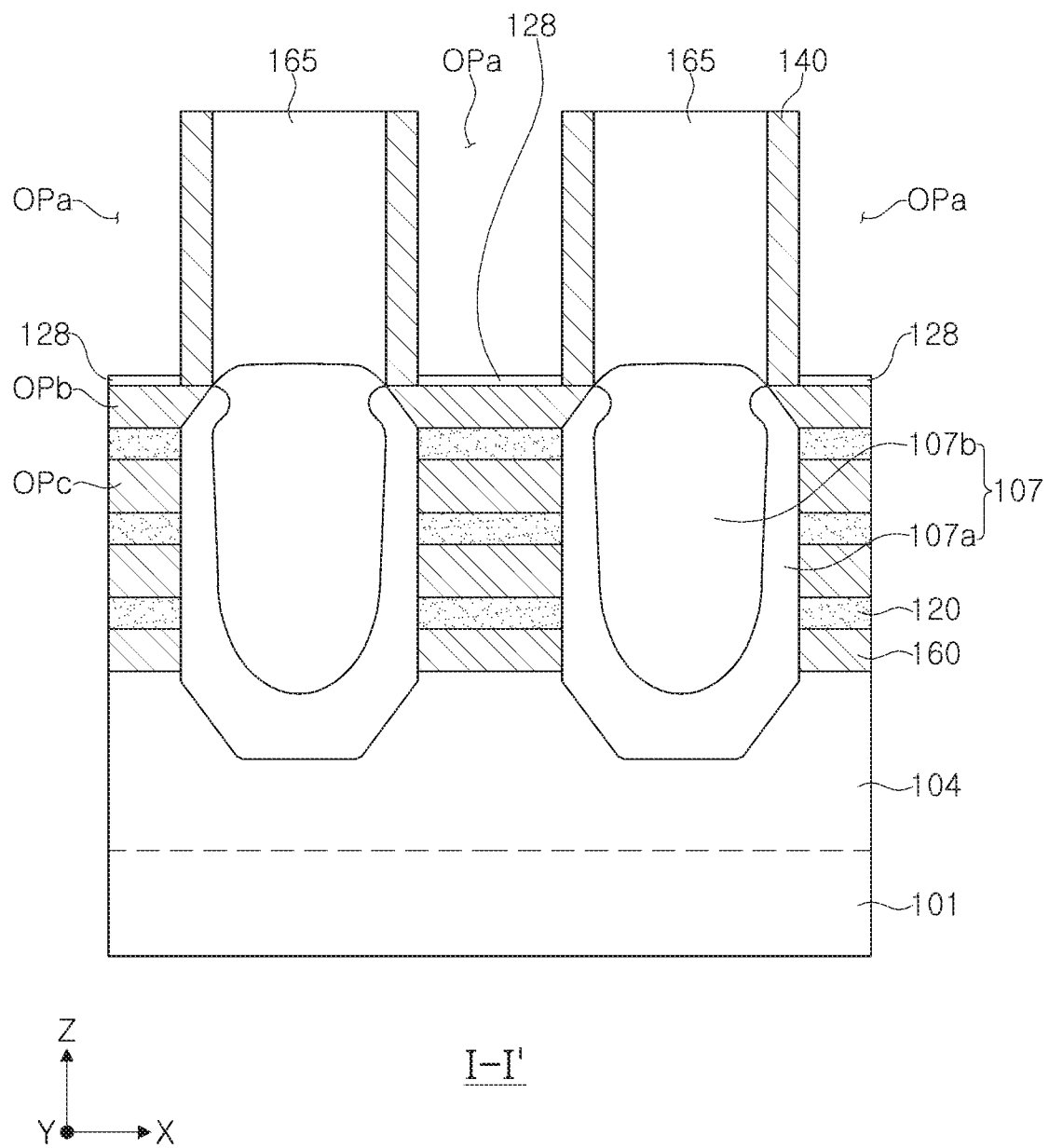

Next, referring to FIG. 13, a dummy gate pattern DG and an etch stop layer 128 may be removed to form a first opening OPa.

Before forming the first opening OPa, an interlayer insulating layer 165 covering the dummy gate pattern DG may be formed. The interlayer insulating layer 165 may be formed outside of the gate spacer 140 to cover the source/drain regions 107. The interlayer insulating layer 165 may be formed by a process of applying an insulating material and a planarization process. The capping layer 135 may be removed by the planarization process, and the dummy gate pattern DG may be exposed. The dummy gate pattern DG and the etch stop layer 128 may be sequentially removed by selective etching.

Figure 14:
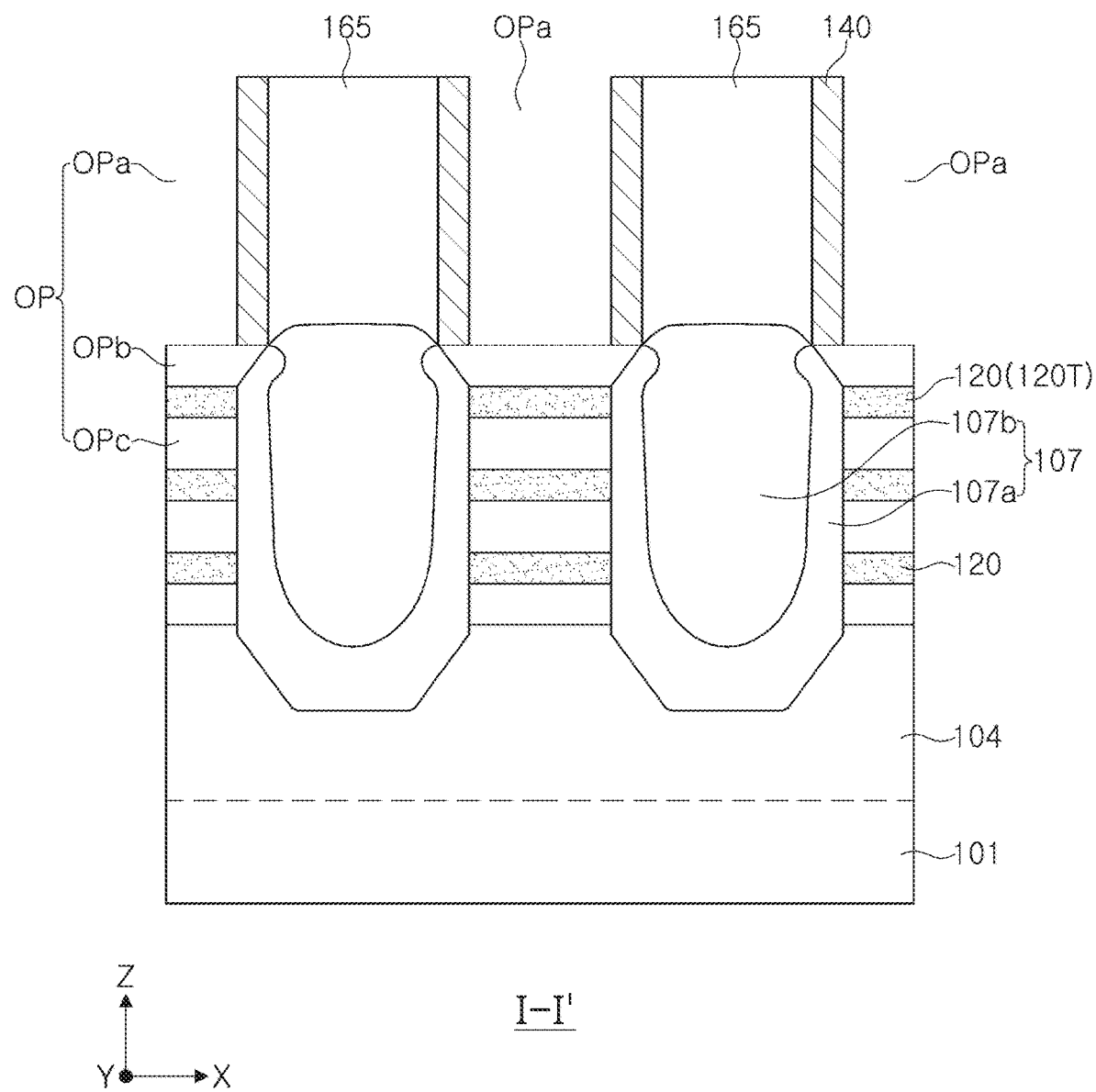

Subsequently, referring to FIG. 14, a plurality of sacrificial patterns 160 may be selectively removed to form second and third openings OPb and OPc.

The second opening OPb is a region from which an uppermost sacrificial pattern 160T is removed, and the third opening OPc is a region from which the sacrificial patterns 160 located between the plurality of channel layers 120 are removed. Since the second opening OPb corresponds to an inclined upper region, the second opening OPb has a width greater than a width of the third opening OPc while having the inclined side surface. The second and third openings OPb and OPc may be connected to the first opening OPa to form one opening OP.

For example, a plurality of channel layers 120 may include Si, and a plurality of sacrificial patterns 160 may include SiGe. In order to selectively remove the plurality of sacrificial patterns 160, an etchant having a greater etching rate of SiGe than Si may be used. For example, an etchant containing hydrogen peroxide ($H_2O_2$), hydrofluoric acid (HF) and acetic acid ($CH_3COOH$), an etchant containing ammonium hydroxide ($NH_4OH$), hydrogen peroxide ($H_2O_2$) and deionized water ($H_2O$), and an etchant containing peracetic acid, or a combination thereof may be used.

Figure 15:
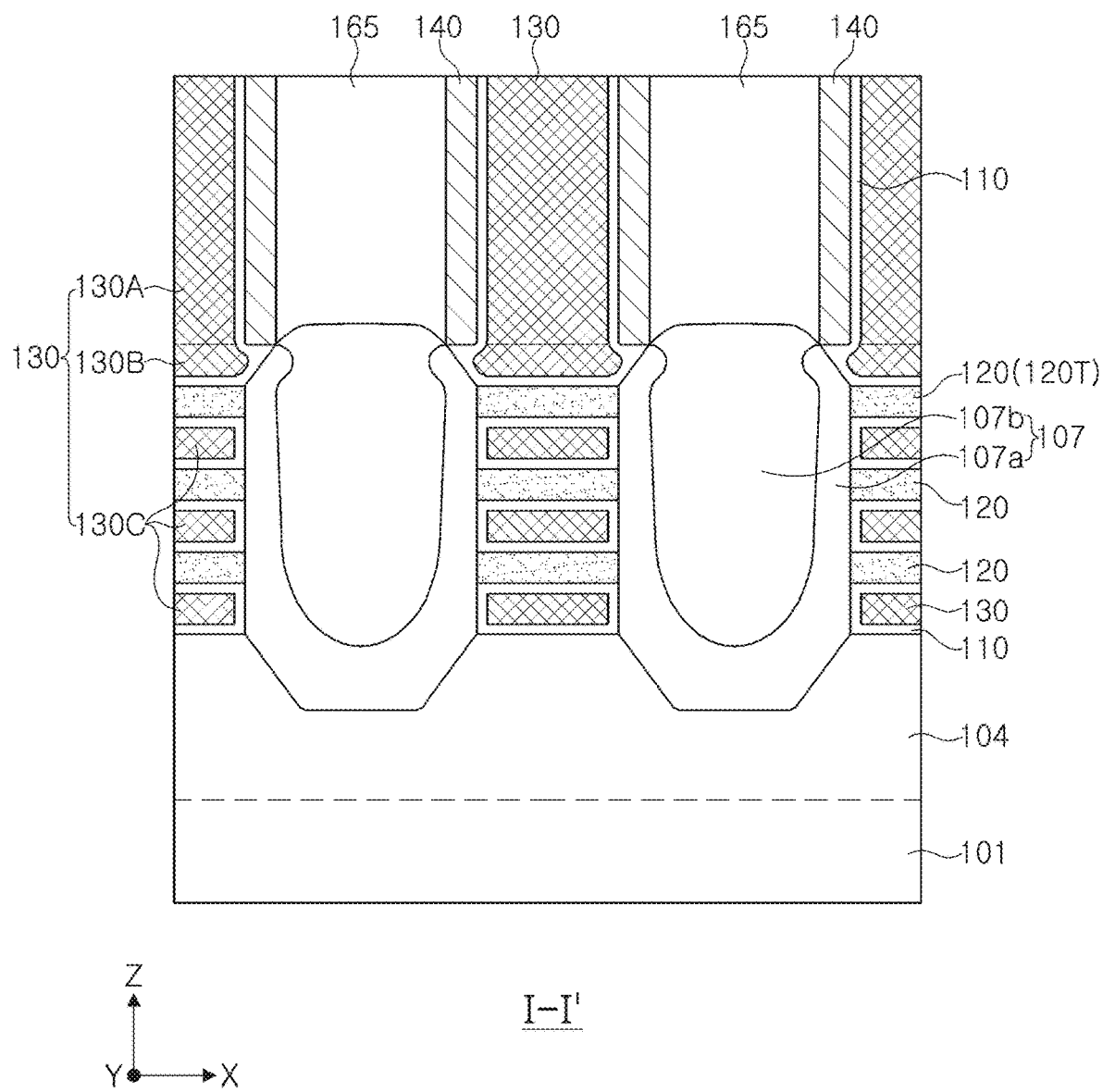

Next, referring to FIG. 15, a gate insulating film 110 and a gate electrode 130 are formed in the opening OP.

As described above, the opening OP may include a first opening OPa positioned between the gate spacers 140, a second opening OPb positioned on an uppermost channel layer 120T below the first opening OPa, and a third opening OPc positioned between the plurality of channel layers.

In the present process, the gate insulating film 110 may be conformally formed on the exposed surfaces of the opening OP. A gate insulating film 110 may be formed to surround each of the channel layers 120. In addition, it may be conformally formed on both sidewalls of the gate spacer 140 exposed to the first opening OPa, a portion of surfaces of the source/drain region 107 exposed to the second opening OPb and an upper surface of the uppermost channel layer 120T. The exposed surface of the source/drain region 107 has an inclined surface. Subsequently, the gate electrode 130 is formed on the gate insulating film 110 to extend in the second direction (e.g., Y direction). Specifically, the gate electrode 130 may be formed to fill the first and second openings OPa and OPb and the third opening OPc between the plurality of channel layers 120.

The gate insulating film 110 may include a high dielectric material having a higher dielectric constant than that of the silicon oxide film. For example, the gate insulating film 110 may include one or more of a hafnium oxide, a hafnium silicon oxide, a lanthanum oxide, a lanthanum aluminum oxide, a zirconium oxide, a zirconium silicon oxide, a tantalum oxide, a titanium oxide, a barium strontium titanium oxide, a barium titanium oxide, a strontium titanium oxide, a yttrium oxide, an aluminum oxide, a lead scandium tantalum oxide, or a lead zinc niobate, but are not limited thereto.

The gate electrode 130 may include a conductive material. For example, the gate electrode 130 may include at least one of TiN, WN, TaN, Ru, TiC, TaC, Ti, Ag, Al, TiAl, TiAlN, TiAlC, TaCN, TaSiN, Mn, Zr, W, and Al. The gate electrode 130 is illustrated as a single layer, but is not limited thereto. For example, as described above, the gate electrode 130 may include a work function conductive layer for adjusting a work function and a conductive layer filling a spaced formed by the work function conductive layer for adjusting a work function.

Figure 16:
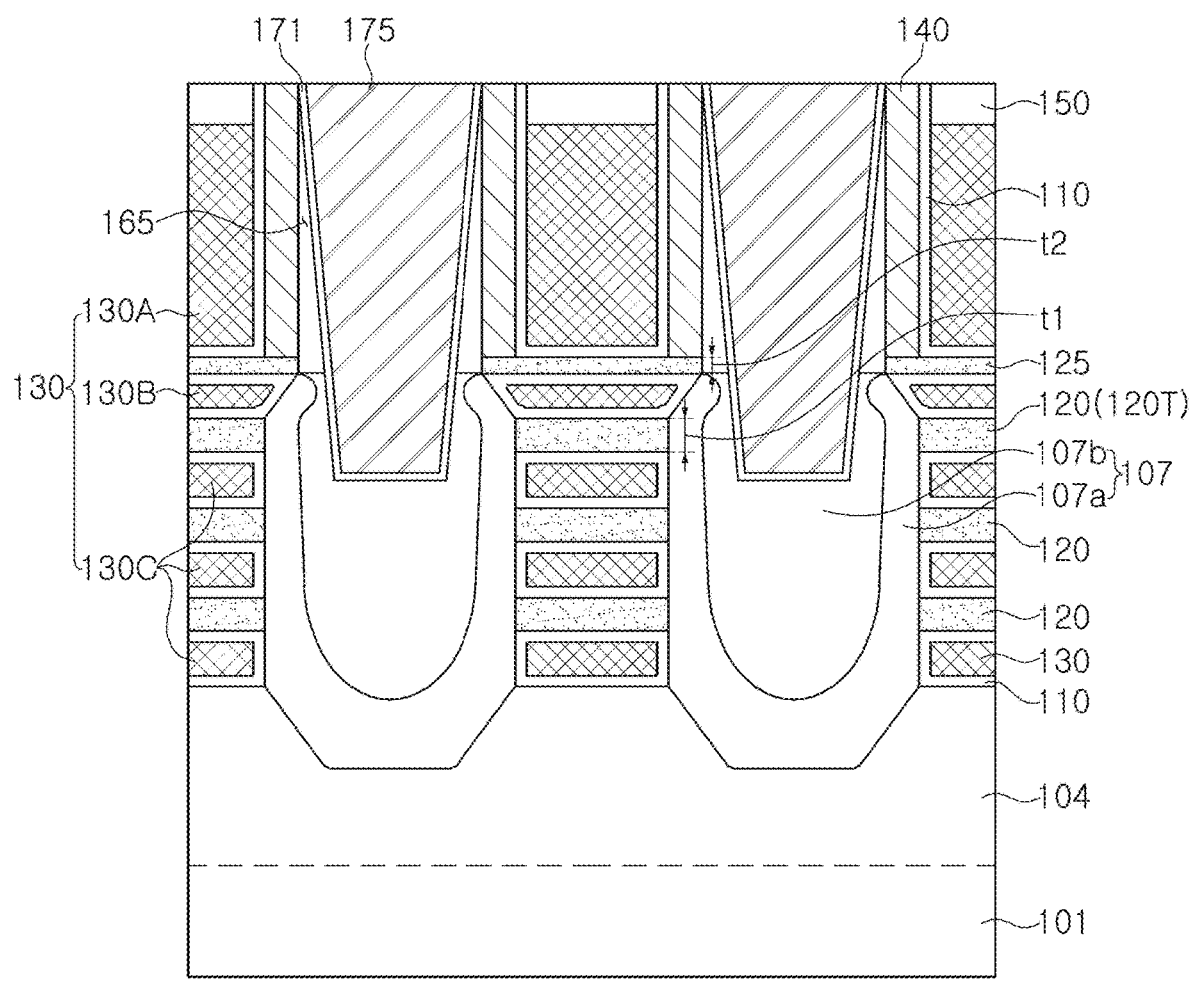
FIG. 16 is a cross-sectional view illustrating a semiconductor device according to an example embodiment.

FIG. 16 is a plan view illustrating a semiconductor device according to an example embodiment of inventive concepts.

Referring to FIG. 16, it can be understood that a semiconductor device 100B according to the example embodiment is similar to the semiconductor device 100 illustrated in FIGS. 1 to 4 except that a silicon cap layer 125 is interposed in upper regions 130A and 130B of the gate electrode 130. In addition, the components of the example embodiment may be understood with reference to the descriptions of the same or similar components of the semiconductor device 100 illustrated in FIGS. 1 and 2 unless specifically described otherwise.

The gate electrode 130 has first and second portions 130A and 130B positioned on the uppermost channel layer 120T of the plurality of channel layers 120, similarly to the previous example embodiment. The second portion 130B is defined as a portion overlapping the source/drain region 107 in the first direction (e.g., X direction), and the first portion 130A may be disposed on the second portion 130B.

The semiconductor device 100B according to the example embodiment may further include a semiconductor cap layer 125 disposed between the first portion 130A and the second portion 130B of the gate electrode 130. The semiconductor cap layer 125 may be obtained by forming the semiconductor cap layer similar to the semiconductor layer 120' on the sacrificial layer 160' as a protective layer in the process of FIG. 6.

For example, the semiconductor cap layer 125 may include the same silicon as the semiconductor layer 120', but in a final structure, the semiconductor cap layer 125 may be formed to have a relatively thin thickness to serve as a protective layer for protecting the sacrificial layer without serving as a channel layer. A thickness t1 of the semiconductor cap layer 125 may be formed to be thinner than a thickness t2 of the semiconductor layer 120. For example, the thickness t1 of the semiconductor cap layer 125 may be formed to be 50% or less of the thickness t2 of the semiconductor layer 120.

As illustrated in FIG. 16, in the cross-section along the first direction (e.g., X direction), the second portion 130b of the gate electrode 130 has an inclined side surface toward the upper surface of the substrate 101. In addition, the gate insulating film 110 may be disposed between the gate electrode 130 and the channel layers 120, as well as between the gate electrode 130 and the semiconductor cap layer 125.

The upper surface of the source/drain region 107 may be formed to have a level of or lower than the upper surface of the second portion 130b of the gate electrode 130. Therefore, the semiconductor cap layer 125 may not be connected to the source/drain region 107, and as a result, it may not act as a channel layer.

As set forth above, according to an embodiment of inventive concepts, by reducing a difference in channel lengths of channel layers, it is possible to reduce strain variation and/or dopant diffusion variation due to an epitaxial of the source/drain region.

Various and advantageous advantages and effects of inventive concepts is not limited to the above description, it will be more readily understood in the process of describing the specific embodiments of inventive concepts.

While the example embodiments have been shown and described above, it will be apparent to those skilled in the art that modifications and variations could be made without departing from the scope of inventive concepts as defined by the appended claims.

What is claimed is:

1. A semiconductor device, comprising:
a substrate, the substrate including an active region extending in a first direction;
a plurality of channel layers on the active region, the plurality of channel layers disposed in a direction perpendicular to an upper surface of the substrate;
a gate electrode respectively surrounding the plurality of channel layers, the gate electrode extending in a second direction crossing the first direction, the gate electrode including a first portion and a second portion on an uppermost channel layer of the plurality of channel layers, the first portion of the gate electrode being on the second portion of the gate electrode, the gate electrode further including a silicon cap layer between the first portion and the second portion of the gate electrode; and
a source/drain structure disposed on both sides of the gate electrode, respectively, and connected to each of the plurality of channel layers,
wherein the second portion of the gate electrode overlaps the source/drain structure in the first direction to provide an overlapped portion of the gate electrode.

2. The semiconductor device of claim 1, wherein in a cross-section in the first direction, the second portion of the gate electrode has an inclined side surface toward the upper surface of the substrate.

3. The semiconductor device of claim 2, wherein an inclined angle of the inclined side surface inclined to the overlapped portion of the gate electrode is in a range of 50° to 80° based on the upper surface of the substrate.

4. The semiconductor device of claim 2, further comprising:
a gate insulating film disposed between the gate electrode and the plurality of channel layers, wherein the gate insulating film extends between the gate electrode and the silicon cap layer.

5. The semiconductor device of claim 4, wherein an upper surface of the source/drain structure has a level at or lower than a level of the upper surface of the second portion of the gate electrode, and the silicon cap layer is not connected to the source/drain structure.

6. The semiconductor device of claim 1, wherein
in a cross-section in the first direction, a width of the uppermost channel layer of the plurality of channel layers has a deviation of 20% or less from a width of an other adjacent channel layer of the plurality of channel layers.

7. The semiconductor device of claim 1, further comprising:
internal spacers disposed on both sides of the gate electrode in the first direction between the plurality of channel layers.

8. The semiconductor device of claim 7, wherein the internal spacers include at least one selected from a group consisting of SiN, SiCN, SiON, SiBN, SiOCN, SiBCN, and SiOC.

9. The semiconductor device of claim 1, wherein the source/drain structure includes a SiGe epitaxial layer.

10. The semiconductor device of claim 9, wherein
the source/drain structure includes a first epitaxial layer and a second epitaxial layer on the first epitaxial layer,
the first epitaxial layer has a first content of Ge, and
the second epitaxial layer has a second content of Ge that is greater than the first content of Ge.

11. The semiconductor device of claim 1, further comprising:
a contact plug connected to the source/drain structure.

12. A semiconductor device, comprising:
a substrate, the substrate including an active region extending in a first direction;
a plurality of channel layers on the active region, the plurality of channel layers disposed in a direction perpendicular to an upper surface of the substrate;
a gate electrode respectively surrounding the plurality of channel layers, the gate electrode extending in a second direction crossing the first direction, the gate electrode including a first portion, a second portion under the first portion, and a third portion under the second portion;

a sidewall of the second portion of the gate electrode being curved, inclined, or both curved and inclined;

a semiconductor cap layer between the first portion of the gate electrode and the second portion of the gate electrode and having a same material as that of each of the plurality of channel layers; and a source/drain structure disposed on at least one side of the gate electrode and connected to the plurality of channel layers, wherein the third portion of the gate electrode is disposed below an uppermost channel layer of the plurality of channel layers, the second portion of the of the gate electrode is disposed on the uppermost channel layer of the plurality of channel layers, and the first portion of the gate electrode extends from a first level to a second level higher than the first level, wherein an upper surface of the source/drain structure is positioned below the first level in a cross-section in the first direction.

13. The semiconductor device of claim 12, wherein the upper surface of the source/drain structure is positioned at a level higher than a level of a lower surface of the second portion of the gate electrode.

14. The semiconductor device of claim 12, wherein the second portion of the gate electrode on the uppermost channel layer of the plurality of channel layers has a region overlapping the source/drain structure in the first direction to provide an overlapped region of the gate electrode.

15. The semiconductor device of claim 14, wherein the overlapped region of the gate electrode has a side surface inclined toward the upper surface of the substrate.

16. The semiconductor device of claim 12, wherein the sidewall of the second portion of the gate electrode is curved and includes a convex curved surface.

17. The semiconductor device of claim 12, further comprising:

a gate insulating film disposed between the gate electrode and the plurality of channel layers, and extends between the second portion of the gate electrode and the source/drain structure.

18. The semiconductor device of claim 12, wherein the third portion of the gate electrode has a width smaller than a width of the gate electrode at the first level.

19. The semiconductor device of claim 12, wherein the semiconductor cap layer has a thickness smaller than that of each of the plurality of channel layers.

20. A semiconductor device, comprising:

a substrate, the substrate including an active region extending in a first direction;

a plurality of channel layers on the active region, the plurality of channel layers disposed in a direction perpendicular to an upper surface of the substrate;

a gate electrode respectively surrounding the plurality of channel layers, the gate electrode extending in a second direction crossing the first direction, the gate electrode including a first portion and a second portion on an uppermost channel layer of the plurality of channel layers, the first portion of the gate electrode being on the second portion of the gate electrode;

a semiconductor cap layer between the first portion of the gate electrode and the second portion of the gate electrode and having a same material as that of each of the plurality of channel layers; and a source/drain structure disposed on at least one side of the gate electrode and connected to the plurality of channel layers, while the source/drain structure being not connected to the semiconductor cap layer.

* * * * *